(12) United States Patent
Richter et al.

(10) Patent No.: US 9,412,848 B1
(45) Date of Patent: Aug. 9, 2016

(54) METHODS OF FORMING A COMPLEX GAA FET DEVICE AT ADVANCED TECHNOLOGY NODES

(71) Applicant: GLOBALFOUNDRIES Inc., Grand Cayman (KY)

(72) Inventors: Ralf Richter, Radebeul (DE); Peter Javorka, Radeburg (DE); Jan Hoentschel, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/615,529

(22) Filed: Feb. 6, 2015

(51) Int. Cl.
　　*H01L 21/331* (2006.01)
　　*H01L 21/8222* (2006.01)
　　*H01L 29/66* (2006.01)
　　*H01L 29/78* (2006.01)

(52) U.S. Cl.
　　CPC ...... *H01L 29/66795* (2013.01); *H01L 29/7841* (2013.01); *H01L 29/7856* (2013.01)

(58) Field of Classification Search
　　CPC ............ H01L 21/762; H01L 21/76224; H01L 21/3105; H01L 21/02567; H01L 21/02579; H01L 21/048; H01L 21/76264; H01L 21/67075; H01L 21/67069; H01L 21/467; H01L 21/475; H01L 27/1104; H01L 29/435; H01L 29/66833; H01L 29/7816; H01L 51/102; H01L 51/0508
　　USPC .......................... 438/311, 700, 197, 706, 745; 257/E21.006, E21.023, E21.045, 257/E21.051, E21.061, E21.126, E21.127, 257/E21.267, E21.229, E21.231, E21.278, 257/E21.304, E21.32, E21.423, E21.435
　　See application file for complete search history.

(56) References Cited

U.S. PATENT DOCUMENTS

| | | | | |
|---|---|---|---|---|
| 6,924,182 B1 * | 8/2005 | Xiang | ............... | H01L 21/76237 438/197 |
| 7,161,206 B2 * | 1/2007 | Oh | .......... | B82Y 10/00 257/316 |
| 7,674,680 B2 * | 3/2010 | Snyder | ................ | H01L 29/7839 438/287 |
| 7,868,327 B2 * | 1/2011 | Jeong | ................ | H01L 29/66757 257/59 |
| 9,048,267 B2 * | 6/2015 | Kondo | ............. | H01L 29/66977 |
| 2014/0151866 A1 * | 6/2014 | Otremba | .......... | H01L 23/49575 257/676 |

* cited by examiner

*Primary Examiner* — David Nhu
(74) *Attorney, Agent, or Firm* — Amerson Law Firm, PLLC

(57) ABSTRACT

The present disclosure provides a method of forming a semiconductor device and a semiconductor device. An SOI substrate portion having a semiconductor layer, a buried insulating material layer and a bulk substrate is provided, wherein the buried insulating material layer is interposed between the semiconductor layer and the bulk substrate. The SOI substrate portion is subsequently patterned so as to form a patterned bi-layer stack on the bulk substrate, which bi-layer stack comprises a patterned semiconductor layer and a patterned buried insulating material layer. The bi-layer stack is further enclosed with a further insulating material layer and an electrode material is formed on and around the further insulating material layer. Herein a gate electrode is formed by the bulk substrate and the electrode material such that the gate electrode substantially surrounds a channel portion formed by a portion of the patterned buried insulating material layer.

20 Claims, 8 Drawing Sheets

METHODS OF FORMING A COMPLEX GAA FET DEVICE AT ADVANCED TECHNOLOGY NODES

BACKGROUND OF THE INVENTION

1. Field of the Invention

The present disclosure generally relates to complex gate-all-around (GAA) field effect transistor (FET) devices at advanced technology nodes, and, more particularly, to GAA FET devices on SOI (silicon-on-insulator) type substrates.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 µm, the more so as current semiconductor technologies are apt of producing structures with dimensions in the magnitude of 100 nm or less. With ICs representing a set of electronic circuit elements integrated on a semiconductor material, normally silicon, ICs may be made much smaller than any discreet circuit composed of separate independent circuit components. Indeed, the majority of present-day ICs are implemented by using a plurality of circuit elements, such as field effect transistors (FETs), also called metal oxide semiconductor field effect transistors or MOSFETs, occasionally also simply referred to as MOS transistors, and passive elements, such as resistors, e.g., diffusion resistors, and capacitors, integrated on a semiconductor substrate within a given surface area. Typical present-day ICs involve millions of single circuit elements formed on a semiconductor substrate.

The basic function of a MOSFET is that of an electronic switching element, controlling a current through a channel region provided between two junction regions which are referred to as source and drain. The control of the conductivity state of the channel region is achieved by means of a gate electrode which is disposed over the channel region and to which a voltage relative to source and drain is applied. In common planar MOSFETs, the channel region extends in a plane between source and drain. Generally, in applying a voltage exceeding a characteristic voltage level to the gate electrode, the conductivity state of the channel is changed, and switching between a conducting state or "ON-state" and a non-conducting state or "OFF-state" may be achieved. It is important to note that the characteristic voltage level at which the conductivity state changes (usually called the "threshold voltage"), therefore, characterizes the switching behavior of the MOSFET and it is a general issue to keep variations in the threshold voltage level low for implementing a well-defined switching characteristic. However, with the threshold voltage depending nontrivially on the transistor's properties, e.g., materials, dimensions, etc., the implementation of a desired threshold voltage value during fabrication processes involves careful adjustment and fine tuning during the fabrication processes, which makes the fabrication of complex semiconductor devices by advanced technologies more and more difficult.

In general, it was observed that, with the sizes of individual MOSFETs having steadily decreased over the last decades, strongly scaled MOSFETs more and more suffered from undesirable effects once the length of the channel of a MOSFET entered the same order of magnitude as the width of the depletion layer of source and drain. For strongly scaled MOSFETs, for example, the OFF-state leakage current (i.e., the leakage current during the OFF-state) increased with the idle power required by the device. Accordingly, these deteriorating effects, which appear at small scales and are associated with a short channel length, are frequently referred to as so-called "short channel effects." In order to continue to lower scales, tremendous efforts are needed to address the issues or marginalities, variabilities and challenges appearing in scaling towards VLSI (very large scale integration) MOSFET technologies at, for instance, 20 nm or less, such that all the marginalities in each individual process step and all variabilities are properly addressed and, at best, reduced.

In the efforts of overcoming the above-described issues encountered when reaching smaller and smaller scales, multi-gate MOSFET devices have been proposed. A kind of multi-gate MOSFET device used for advanced 22/14 nm technologies is realized as a so-called "FinFET." In general, FinFETs represent three-dimensional transistors formed by thin fins extending upwardly from a semiconductor substrate, where particularly the transistor's channel is three-dimensional. For example, in some designs of FinFET devices, the channel is formed along the vertical sidewalls of the fin (which is also referred to as a "double-gate transistor") or along the vertical sidewall surfaces and the upper horizontal surface of the fin (leading to so-called "tri-gate transistors"). Double-gate transistors and tri-gate transistors have wide channels and, on the other hand, high performance, which can be achieved without substantially increasing the area of the substrate surface required by these transistors because a transistor's performance, being measured by its transconductance, is proportional to the width of the transistor channel. Therefore, by the multi-gate configuration provided by the three-dimensional channel of FinFETs, these semiconductor devices allow for a better control of the channel region when compared to common planar transistor devices.

In order to reach the next generation technology nodes, i.e., at nodes smaller than 14 nm, e.g., 10 nm/7 nm, new device concepts are currently under evaluation, such as field effect transistor devices or FET devices of the gate-all-around (GAA) type. Basically, GAA FETs are similar in concept to FinFETs except that the gate material surrounds the channel region on all sides of the channel. GAA FETs are expected to have a reduced leakage current and power consumption when compared to conventional FinFET devices due to the enhanced gate control implemented by a gate of the GAA type as, opposed to the gate control achieved in FinFET devices, the gate of FinFET devices "only" controls the channel from three sides. However, at present, a consistent concept of fabricating GAA FETs at advanced technology nodes has not been proposed, particularly smaller than 10 nm/7 nm.

Therefore, it is desirable to provide a method of forming a semiconductor device and a semiconductor device for implementing GAA FET structures at advanced technology nodes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a semiconductor device is provided. In accordance with some illustrative embodiments herein, the method includes providing an SOI substrate portion with a semiconductor layer, a buried insulating material layer and a bulk substrate, wherein the buried insulating material layer is interposed between the semiconductor layer and the bulk substrate, patterning the SOI substrate portion and forming a patterned bi-layer stack from the buried insulating material layer and the semiconductor layer on the bulk substrate, the bi-layer stack comprising a patterned buried insulating material layer and a patterned semiconductor layer, enclosing the bi-layer stack with an insulating material layer, and forming an electrode material on and around the insulating material layer, wherein a gate electrode is formed by the bulk substrate and the electrode material such that the gate electrode substantially surrounds a channel portion formed by a portion of the patterned semiconductor layer.

In a second aspect of the present disclosure, a semiconductor device is provided. In accordance with some illustrative embodiments herein, the semiconductor device includes a bulk substrate, a semiconductor fin structure formed over the bulk substrate, wherein the semiconductor fin structure is separated from the bulk substrate by a buried insulating material layer interposed between the semiconductor fin structure and the bulk substrate, the semiconductor fin portion including source/drain regions formed at opposing end portions of the semiconductor fin structure, and a channel region extending between the source/drain regions, wherein the semiconductor device further includes an insulating material layer formed over the semiconductor fin structure such that the buried insulating material layer and the insulating material layer substantially enclose the semiconductor fin structure, and an electrode material formed on the insulating material layer over the channel region, wherein a gate electrode is formed by the bulk substrate and the electrode materials such that the gate electrode substantially surrounds the channel portion.

BRIEF DESCRIPTION OF THE DRAWINGS

The disclosure may be understood by reference to the following description taken in conjunction with the accompanying drawings, in which like reference numerals identify like elements, and in which.

Figure 1A:
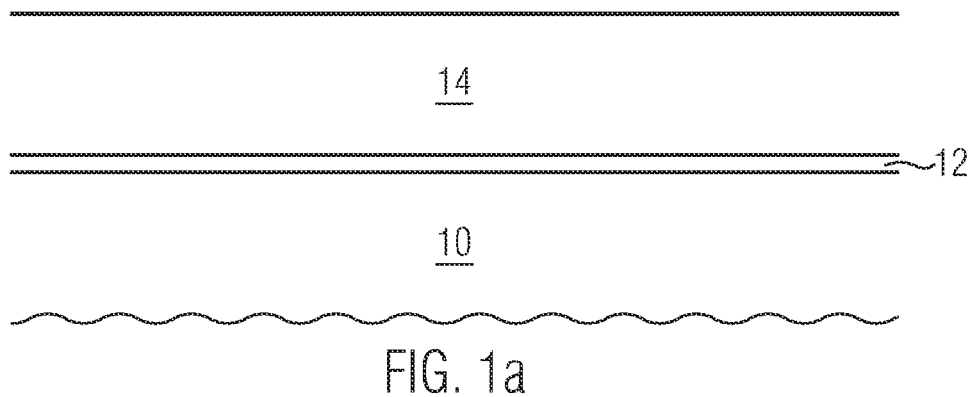
FIGS. 1a-1f schematically illustrate a process flow in accordance with some illustrative embodiments of the present disclosure for forming a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and two semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length and/or width dimensions smaller than 100 nm, for example smaller than 50 nm or smaller than 35 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device being designed.

In the following, various illustrative embodiments of the present disclosure will be explicitly described with regard to the enclosed figures, wherein fin structures are provided in an upper surface of a substrate.

FIG. 1a schematically illustrates, in a cross-sectional view, an SOI substrate portion used for fabricating semiconductor devices in accordance with some illustrative embodiments of the present disclosure. The SOI substrate portion comprises a bulk substrate 10, e.g., a semiconductor substrate, e.g., a silicon or silicon/germanium substrate, or a semiconductor support wafer or the like. In general, the terms "substrate," "semiconductor substrate" or "semiconducting substrate" should be understood to cover all semiconductor materials and no limitation to a special kind of material is intended.

Furthermore, a thin layer of insulating material 12, also referred to as a buried insulating material layer, is disposed on the bulk substrate 10. For example, the buried insulating material layer 12 may be formed by an oxide material so as to represent a buried oxide layer, such as at least one of a silicon oxide material, e.g., silicon dioxide, and a hafnium oxide material, e.g., $HfO_2$, and the like. In accordance with some alternative embodiments of the present disclosure, the buried insulating material layer 12 may be formed by sapphire.

With continued reference to FIG. 1a, a semiconductor layer 14 is further depicted, the semiconductor layer 14 being formed on the buried insulating material layer 12 such that the buried insulating material layer 12 is interposed between the semiconductor layer 14 and the bulk substrate 10. In accordance with some illustrative embodiments of the present disclosure, the semiconductor layer 14 may comprise silicon, silicon/germanium and the like.

In accordance with some illustrative embodiments of the present disclosure, the SOI substrate portion as illustrated in FIG. 1a may be undoped or at least locally doped. Furthermore, at least one of the semiconductor layer 14 and the bulk substrate 10 may have dopants implanted therein during an implantation sequence (not illustrated). For example, the SOI substrate portion may be doped in accordance with techniques that are known for forming wells in the bulk substrate 10. Furthermore, a doping of the semiconductor layer 14 may be optional and dopants may be implanted at least locally into the semiconductor layer 14.

The person skilled in the art will appreciate that, in accordance with some illustrative embodiments of the present disclosure, the SOI substrate portion as illustrated in FIG. 1a may be formed in accordance with one of SIMOX and smart cut process techniques (not illustrated). For example, oxygen ions may be implanted into an upper surface of the semiconductor substrate 10 in a SIMOX process so as to form an oxygen-rich layer at a certain depth, i.e., at a depth corresponding to the depth at which the buried insulating material layer 12 is to be formed. Subsequently, a high temperature annealing process may be applied to form silicon oxide, e.g., silicon dioxide, from the oxygen-rich layer such that the described process results in the formation of a buried oxide layer corresponding to the buried insulating material layer 12 in these embodiments. Accordingly, during the SIMOX process, a high dose of oxygen ions may be implanted into the semiconductor substrate 10 and the implanted high dose of oxygen ions my convert into a high dose of oxygen implanted into the semiconductor substrate at a depth which substantially corresponds to a depth at which the buried insulating material layer 12 is to be formed. Subsequently, the implanted oxygen is converted to silicon oxide during a subsequently performed high temperature annealing process.

Alternatively, the SOI substrate portion illustrated in FIG. 1a may be fabricated in accordance with smart cut process techniques, wherein the bulk substrate 10 is provided and an insulating material is formed thereon, e.g., by exposing the bulk substrate 10 to a surface oxidation process for forming an oxide layer at an upper surface of the bulk substrate 10. Thereafter, hydrogen ions are implanted into the bulk substrate 10 at a greater depth below the surface oxide (not illustrated) and, after the hydrogen implantation is completed, the accordingly treated bulk substrate 10 is flipped and bonded to a handle wafer. Subsequently, the composed substrate (bulk substrate and handle wafer) is exposed to a hot carrier annealing process causing bubbles to be formed from the implanted hydrogen and, accordingly, a layer of increased internal stress is formed that allows to break the composed substrate at the hydrogen implant layer such that an SOI-type structure is obtained. Thereafter, a chemical mechanical polishing (CMP) process may be performed. Accordingly, ultra-thin silicon films on insulated buried oxide layers may be fabricated, as well as the thickness of the buried oxide layer 12 may be adjusted in appropriately oxidizing an upper surface of the semiconductor substrate 10. Basically, in accordance with smart cut techniques, a silicon film, i.e., the semiconductor layer 14, may be transferred to a mechanical support, such as the bulk substrate 10, thereby introducing an intermediate insulating layer, such as the buried insulating material layer 12.

The person skilled in the art will appreciate that the present disclosure is not limited to the above-described processes and that, in general, any process may be performed for forming an insulating material layer on a substrate and thereafter forming a semiconductor material layer on the formed insulating material layer.

In accordance with some illustrative embodiments of the present disclosure, as it is illustrated with regard to FIG. 1a, a modified FDSOI substrate material may be used in the fabrication process of semiconductor devices. For example, on the road map of 428 nm/40 nm/10 nm technologies, it is proposed to use an FDSOI substrate modified with regard to some aspects, e.g., the thickness of the buried insulating material layer 12 and/or the quality of the buried insulating material layer 12 and/or the uniformity of the buried insulating material layer 12 and/or the dielectric constant or k-value of the buried insulating material layer 12. In some explicit examples herein, the buried insulating material layer may have a thickness of substantially less than about 10 nm, or substantially less than about 5 nm, such as, for example, about 2 nm, or in the range from about 1 nm to about 4 nm. For example, the buried insulating material layer 12 may have a k-value of at least 3, e.g., k may be about 3.9 and more. For example, a uniformity of the buried insulating material layer 12 may be provided by a specific variation in the thickness of the buried insulating material layer 12, at least over a portion in and on which a semiconductor substrate is to be formed.

Figure 1B:
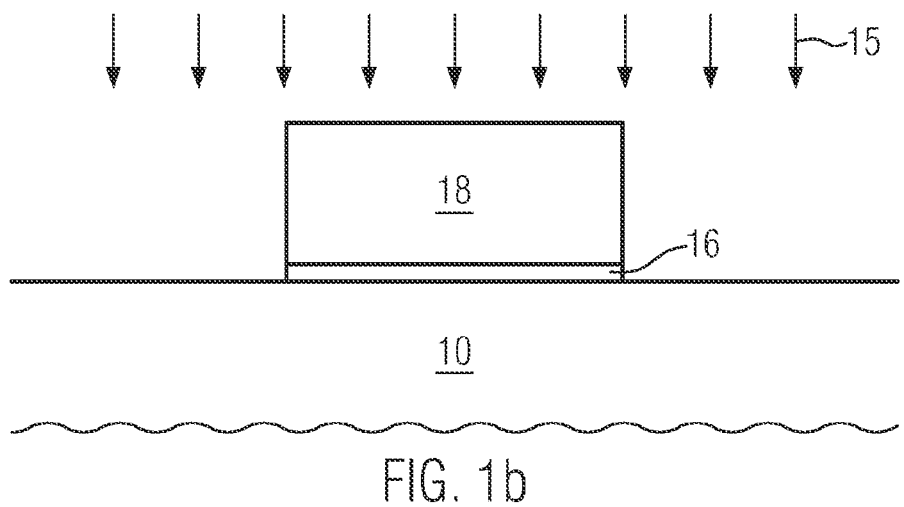

Next, as illustrated in FIG. 1b, a bi-layer stack may be formed on an upper surface of the bulk substrate 10 in performing a patterning process 15. In accordance with some illustrative embodiments of the present disclosure, the patterning process 15 may comprise forming a masking pattern (not illustrated) on the semiconductor layer 14 (see FIG. 1a), e.g., by lithographical techniques, and subsequently performing an etch process for etching the semiconductor layer 14 and the buried insulating material layer 12 in accordance with the masking pattern so as to obtain the bi-layer stack 16, 18 as depicted in FIG. 1b. In accordance with some illustrative embodiments of the present disclosure, the etch process may comprise an anisotropic etch, e.g., one of a dry and wet etch. For example, the etch process may be a multistage etch process which uses, in a first etch stage, the buried insulating material layer 12 (see FIG. 1a) as an etch stop when selectively etching the semiconductor layer 14 to result in the patterned semiconductor layer 18 of the bi-layer stack shown in FIG. 1b. During a second etch stage, the buried insulating material layer 12 may be selectively etched relative to the material of the patterned semiconductor layer 18 and the bulk substrate 10, using the bulk substrate 10 as an etch stop such that upper surface portions of the bulk substrate 10 adjacent to the bi-layer stack formed by the patterned semiconductor layer 18 and the patterned buried insulating material layer 16 are present. The bi-layer stack comprises the patterned semiconductor layer 18 and the patterned insulating material layer 16.

Figure 1C:
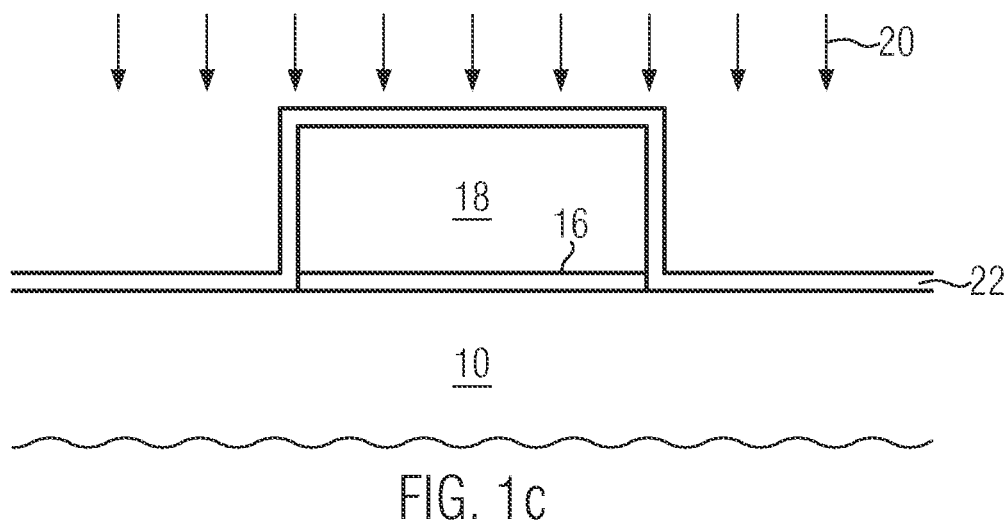

Referring to FIG. 1c, a process 20 may be subsequently performed for depositing a further insulating material layer 22 over the bi-layer stack 16, 18 and the exposed upper surface portions of the semiconductor substrate 10. In accordance with some illustrative embodiments of the present disclosure, the insulating material layer 22 may substantially match the buried oxide layer 16 in at least one of thickness, k-value or dielectric constant, quality and material. For example, at least one of thickness and k-value may deviate for about 50% or less, e.g., for about 30% or less, preferably 10% or less, and more preferably for about 5% or less. In accordance with some special examples herein, the insulating material layer 22 may be provided by an oxide layer formed by at least one of silicon oxide, hafnium oxide and the like.

The person skilled in the art will appreciate that the expression "quality" as used herein concerns reliability properties/characteristics of the material forming the gate insulating material, such as the gate oxide of a semiconductor device. In accordance with some aspects of the present disclosure, the reliability properties/characteristics of the buried insulating material 12 and the insulating material layer 22, e.g., of a buried oxide material or BOX material and a gate oxide material or GOX material, are to be understood as being similar or best matched, i.e., the reliability properties/characteristics of the buried insulating material 12 and the insulating material layer 22 deviate by less than 50%, such as less than 30% or less than 25% or less than 10% or less than 5% or less than 1%, from another. In accordance with some illustrative embodiments herein, an example of an illustrative reliability property/characteristic may be the voltage at which at least one of the insulating materials 12, 22 is destroyed (dielectric breakdown). For example, the voltage or electric field strength at which at least one of the materials 12, 22 may be, for example, a high effective dielectric breakdown field of about 1 MV/cm or more, such as about 3 MV/cm or more, e.g., at least about 5 MV/cm or at least about 9 MV/cm or at least about 12 MV/cm or at least about 18 MV/cm, or a maximum operating voltage of about 1 V or more, e.g., about ±2.74 V or more, at 25° C. and about 1 V or more, such as about ±2.32 V, at 125° C. for stacks having an EOT (equivalent oxide thickness) of about 1 nm or more, e.g., an EOT equal to or greater than about 1.5 nm or 2.3 nm, optionally under a ten-year lifetime evaluation. In some examples, the breakdown voltages may be even in the order of about 5 V or more, such as about 6 V or 9 V or more. In accordance with other examples, an average electrical resistivity at 1 MVcm-1 may be in the range from about $10^{13}$ Ω cm to $10^{15}$ Ω cm, e.g., at about $10^{14}$ Ω cm. The person skilled in the art will appreciate that, as the dielectric breakdown of a material further depends on the composition of the material, e.g., purity of the material and/or the absence of impurities, according levels of purity and/or impurities may be chosen. For example, the level of impurities and/or the purity of the insulating materials 12, 22 may be matched.

It is noted that, in matching the quality of the buried insulating material 12 and the insulating material 22, the risk of breakdown of the insulating materials 12, 22 is reduced because a breakdown occurs at the "weakest" insulating material and, in matching according properties/characteristics, the overall strength of a gate insulating material under fabrication may be at least maintained, if not increased.

In accordance with some illustrative examples of the present disclosure, the material of the buried insulating material layer 16 may be one of silicon oxide, hafnium oxide and the like. Additionally or alternatively, the material of the insulating material layer 22 may be one of silicon oxide, hafnium oxide and the like.

Figure 1D:
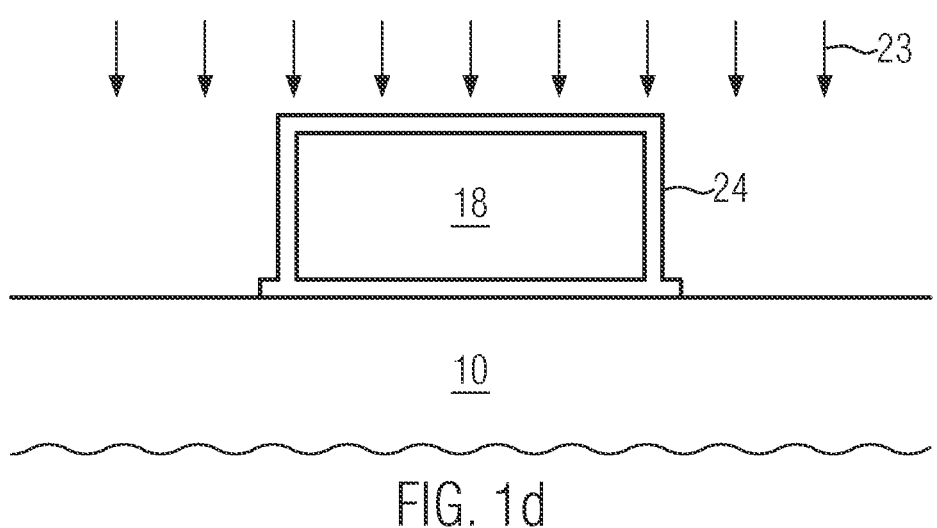

Next, as illustrated in FIG. 1d, the deposited insulating material layer 22 is patterned during a process 23, e.g., by lithographical techniques and etch processes for anisotropically etching the deposited insulated material layer 22 (see FIG. 1c) such that the patterned semiconductor layer 18 is surrounded by the deposited insulating material 24. Although FIG. 1d explicitly illustrates that the surrounding insulating material 24 matches the patterned buried insulating material layer 16 (see FIG. 1c), this does not pose any limitation on the present disclosure and the person skilled in the art will appreciate that the deposited and patterned insulating material layer 24 covering sidewalls and an upper surface of the patterned semiconductor layer 18 may be possibly different from the patterned buried insulating material layer 16.

As illustrated in FIG. 1d, a masking patterning (not illustrated) for patterning the deposited insulating material layer 22 may not exactly align with the bi-layer stack such that L-shaped portions covering sidewall portions of the patterned insulating material 24 may be obtained.

Figure 1E:
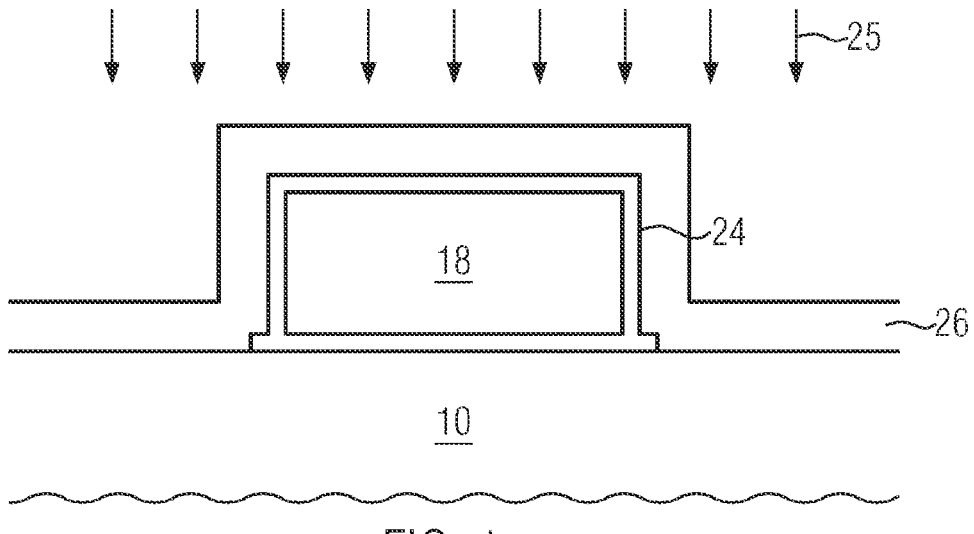

Referring to FIG. 1e, an electrode material 26 is deposited over the patterned insulating material layer 24 and the bulk substrate 10. Subsequently, a patterning and etching process 25 is performed to pattern the deposited electrode material 26, e.g., by conventional lithographic techniques, and an anisotropic etching, e.g., wet or dry, is performed. In accordance with some illustrative examples, the electrode material 26 may be one of polysilicon, amorphous silicon and a metal.

Figure 1F:
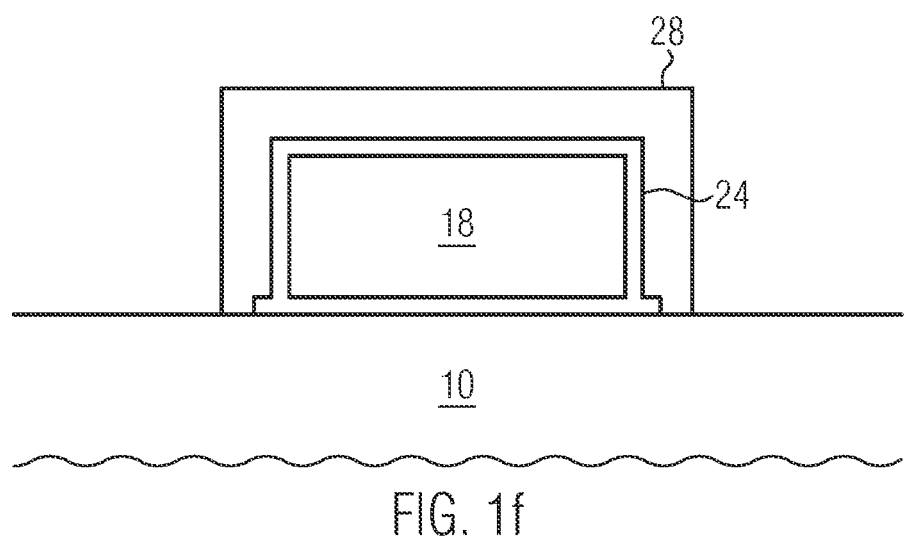

FIG. 1f schematically illustrates, in a cross-sectional view, a patterned electrode material 28 formed over the patterned insulating material 24 surrounding the patterned semiconductor layer 18. The person skilled in the art will appreciate that the patterned electrode material 28 and the bulk substrate 10 are substantially coupled in an electrically conducting way such that a gate electrode is formed by the semiconductor substrate 10 and the patterned electrode material 28, the gate electrode substantially surrounding the semiconductor material layer 18.

Figure 2A:
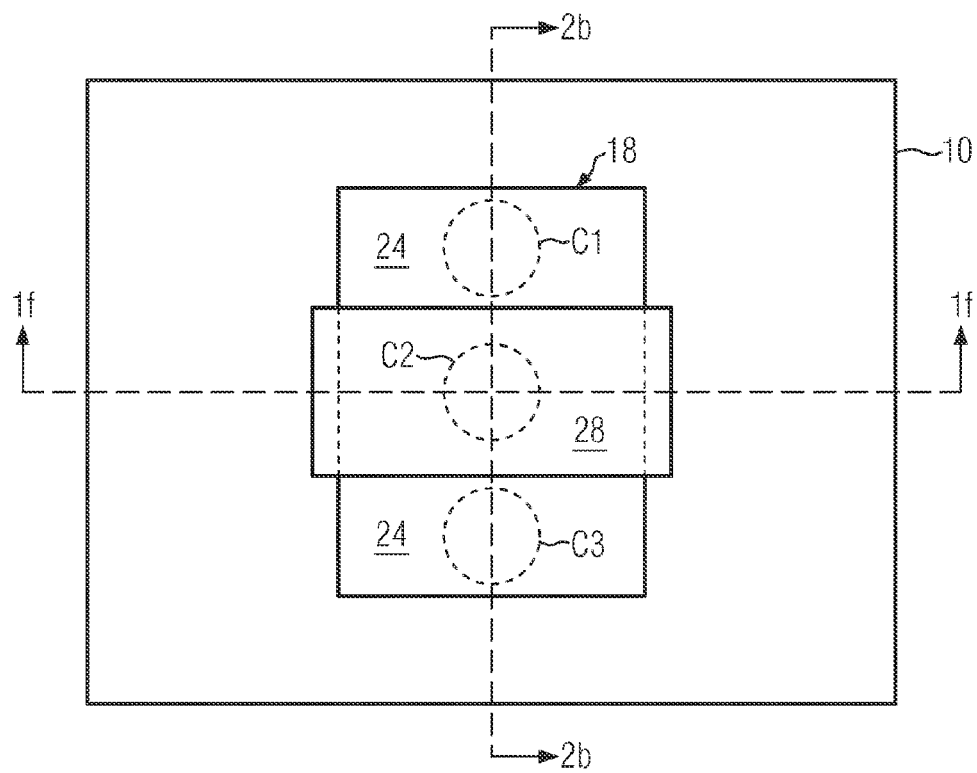
FIGS. 2a-2b schematically illustrate in a top view (FIG. 2a) and a cross-sectional view (FIG. 2b) a semiconductor device as fabricated by the process flow illustrated in FIGS. 1a-1f.

FIG. 2a schematically illustrates, in a top view, the SOI substrate portion as depicted in the cross-sectional view of FIG. 1f. That is, an orientation of the cross-section as illustrated in FIG. 1f is schematically depicted by the line 1f-1f in FIG. 2a. As it is visible from FIG. 2a, the electrode material 28 surrounds the patterned semiconductor layer 18 and the patterned insulating material 24 along a direction transverse to a length dimension of the patterned semiconductor material layer 18. Particularly, portions of an upper surface of the patterned insulating material layer 24 located at opposing sides of the patterned semiconductor layer 18 are not covered by the electrode material 28.

Subsequently, contacts C1, C2 and C3 may be provided for contacting the patterned semiconductor layer 18 at opposing ends (where source/drain regions are to be formed), while by contact C2, the electrode material 28, i.e., the gate electrode, is contacted. The person skilled in the art will appreciate that an additional gate electrode contact (not illustrated) for contacting the bulk substrate 10 may be provided.

Figure 2B:
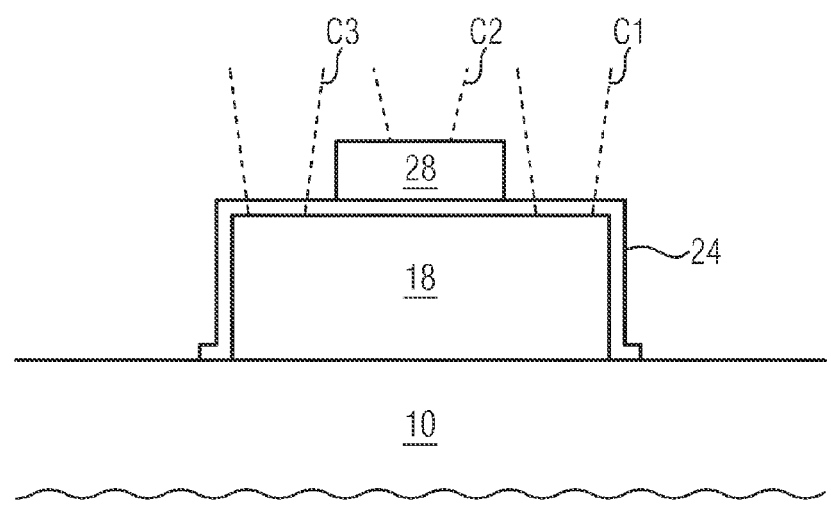

FIG. 2b schematically illustrates a cross-section of FIG. 2a taken along the line 2b-2b. Herein, the contacts C1, C2 and C3

(which are to be formed during subsequent processing) are indicated by broken lines. In accordance with some illustrative embodiments of the present disclosure, further processing for forming the contacts C1, C2 and C3 may include locally removing the exposed insulating material 24 (i.e., insulating material 24 that is not covered by the patterned electrode material 28), and landing with the contacts C1, C3 within the opened insulating material 24 to contact the semiconductor material layer 18. Furthermore, the electrode material 28 is contacted by the contact C2.

The person skilled in the art will appreciate that device implant steps, e.g., for forming source/drain regions, are not specified in detail throughout the description and many options to realize implantations are possible. For example, with regard to an early stage during fabrication as illustrated in FIG. 1a, the SOI substrate portion as illustrated in FIG. 1a may be doped by implanting dopants directly at the beginning of the process flow before patterning of the substrate material (i.e., before the process 15 in FIG. 1b). Accordingly, a conductivity of at least one of the bulk substrate 10 and the semiconductor layer 14 (and 18, respectively) may be appropriately adjusted or tuned. For example, the bulk substrate 10 may be at least doped in a region where the gate electrode is formed such that a conductivity of the bulk substrate 10 may be at least 10%, preferably 50% or higher, of the conductivity of the electrode material 26 and 28, respectively.

Furthermore, the person skilled in the art will appreciate that source/drain implants may be implanted directly after patterning of the electrode material 26 in FIG. 1e, i.e., after the process 25 as illustrated in FIG. 1e is completed. For example, the implantation of source/drain implants may be performed at the stages during fabrication associated with the semiconductor device illustrated in FIGS. 1f, 2a and 2b.

Figure 3A:
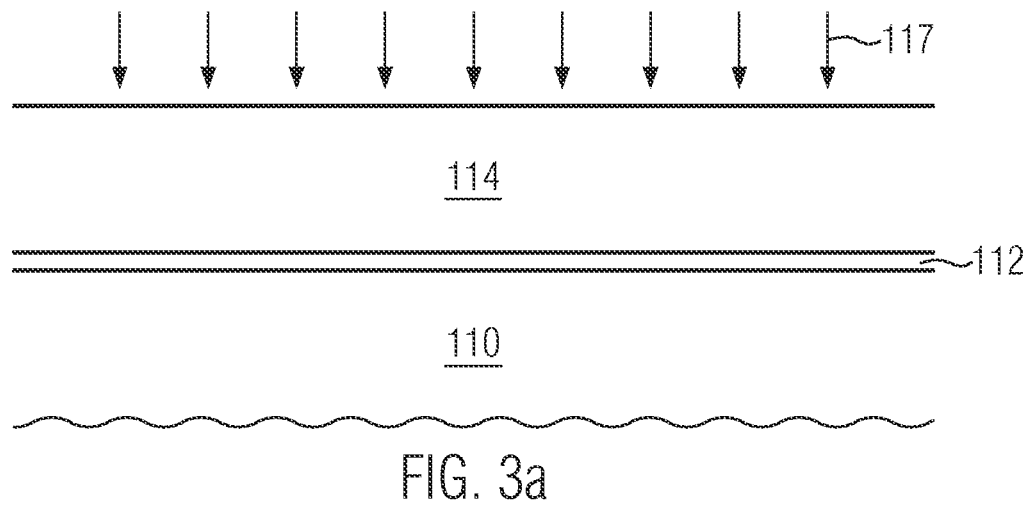
FIGS. 3a-3h schematically illustrate a process flow for forming a semiconductor device in accordance with some other embodiments of the present disclosure.

With regard to FIGS. 3a-3h, further illustrative embodiments of the present disclosure are described. Herein, FIG. 3a schematically illustrates a substrate material which is substantially similar or equal to the substrate material depicted in FIG. 1a. That is, a semiconductor material layer 114 is provided on a buried insulating material layer 112 which in turn, is disposed on a bulk substrate 110. The person skilled in the art will appreciate that at least one of the semiconductor material layer 114, the buried insulating material layer 112 and the bulk substrate 110 may be provided in accordance with the respective disclosure provided above with regard to FIG. 1a.

Figure 3B:
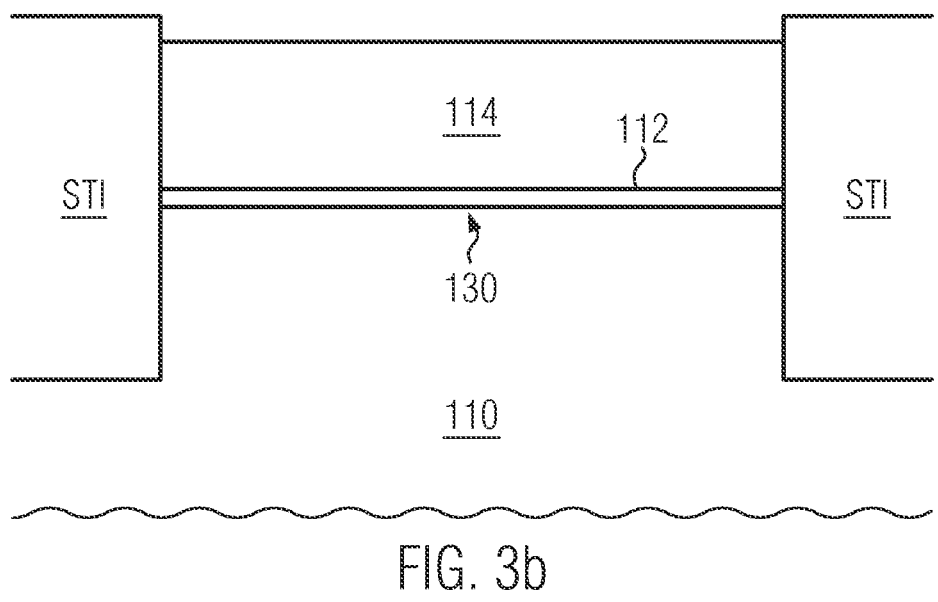

Next, a patterning process 117 may be performed for forming an active region 130 (FIG. 3b) in an upper portion of the bulk substrate 110 which is delineated by STI regions (shallow-trench-isolation regions denoted by "STI" in the figures) that enclose the active region 130. The person skilled in the art will appreciate that the process 117 may include a patterning sequence, e.g., by lithographical techniques, and an anisotropic etch process for forming trenches (not illustrated) within the semiconductor material layer 114, the trenches extending through to the bulk substrate 110, and filling the formed trenches by an insulating material for forming the STI regions as depicted in FIG. 3b.

In accordance with some illustrative embodiments of the present disclosure, the active region 130 may be one of an undoped region or doped region, i.e., at least one of the semiconductor layer 114 and the bulk substrate 110 may have dopants implanted therein during an implantation sequence (not illustrated). For example, the active region 130 may be doped in accordance with techniques that are known for forming wells in the bulk substrate 110. A doping of the semiconductor layer 114 may be optional and dopants may be implanted at least into the semiconductor layer 114, at least at the active region 130 for appropriately adjusting a conductivity of at least the semiconductor layer 114 to implement a desired conductivity of at least the semiconductor layer 114.

Figure 3C:
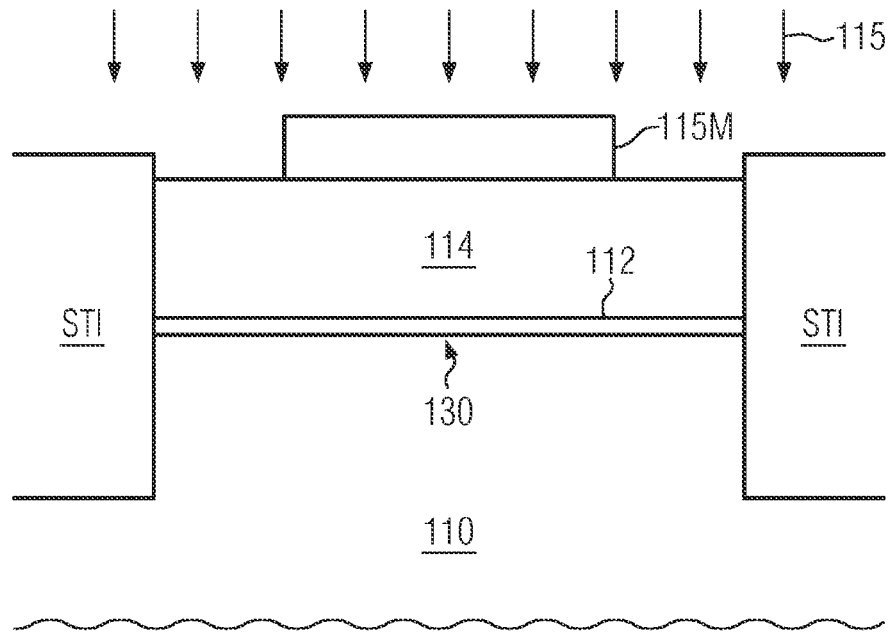
Figure 3D:
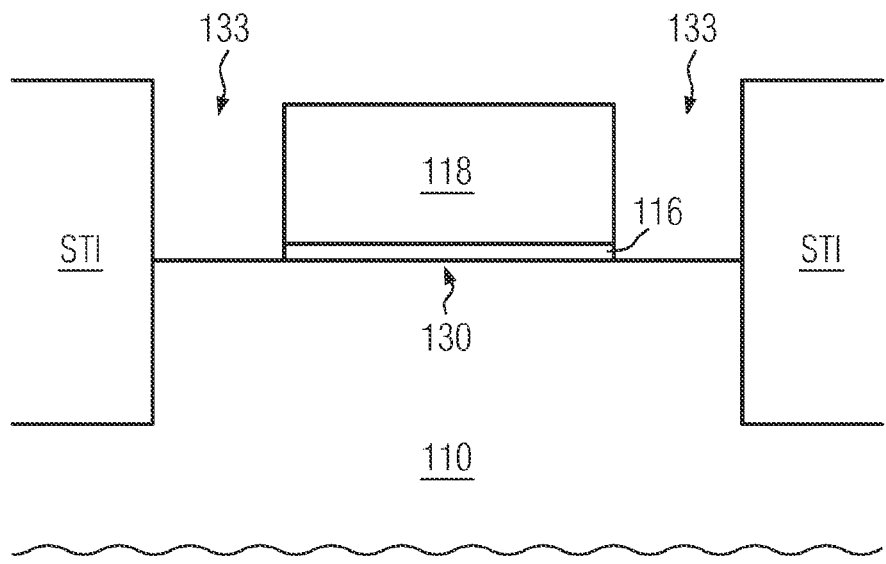

Referring to FIG. 3c, a patterning process 115 similar to the process 15 as described with regard to FIG. 1c may be performed. For example, a mask pattern 115M may be formed on the semiconductor material layer 114 in the active region 130. After performing an anisotropic etch process, trenches 133 are formed in alignment with the mask pattern 115M at opposing sides of a patterned semiconductor material layer 118, the trenches 133 extending down to the bulk substrate 110 for exposing upper surface regions of the bulk substrate 110 so as to define a patterned buried insulating material layer 116, as shown in FIG. 3d.

Figure 3E:
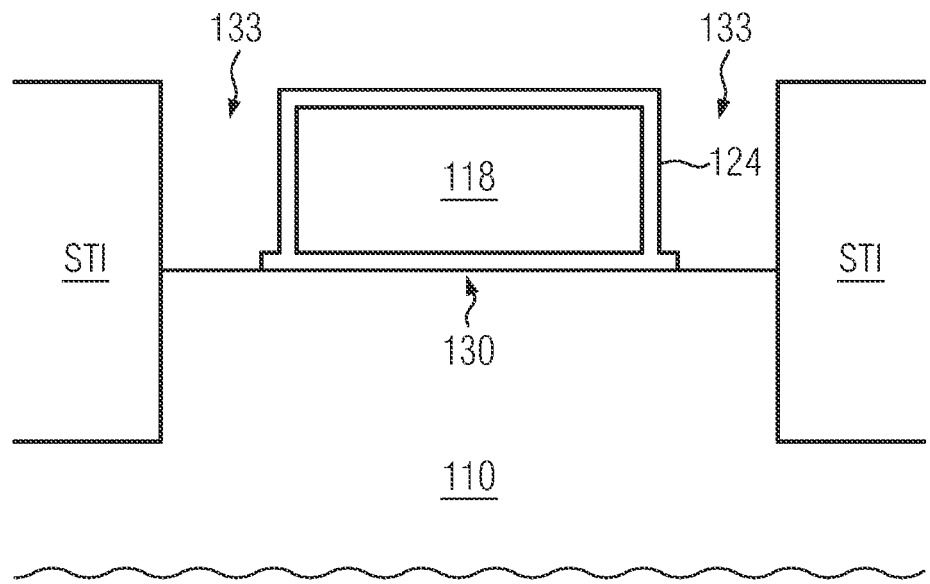

Referring to FIG. 3e, the patterned semiconductor material layer 118 is enclosed by an insulating material 124 in accordance with techniques as described above with regard to FIGS. 1c and 1d.

Figure 3F:
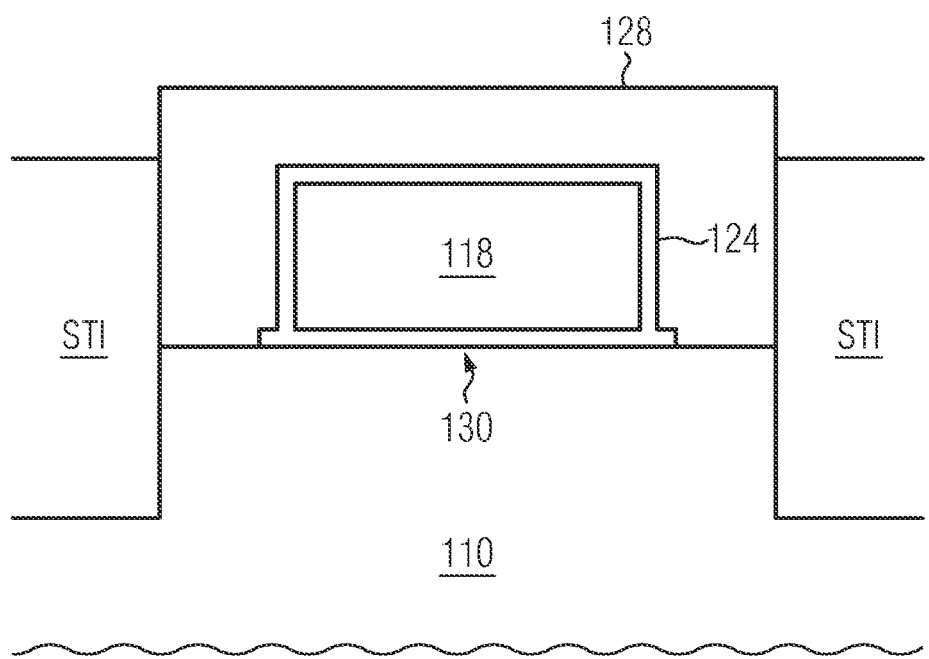

Next, as shown in FIG. 3f, a patterned electrode material 128 may be formed overlying the semiconductor material layer 118 in accordance with techniques as described above with regard to FIGS. 1e and 1f.

Figure 3G:
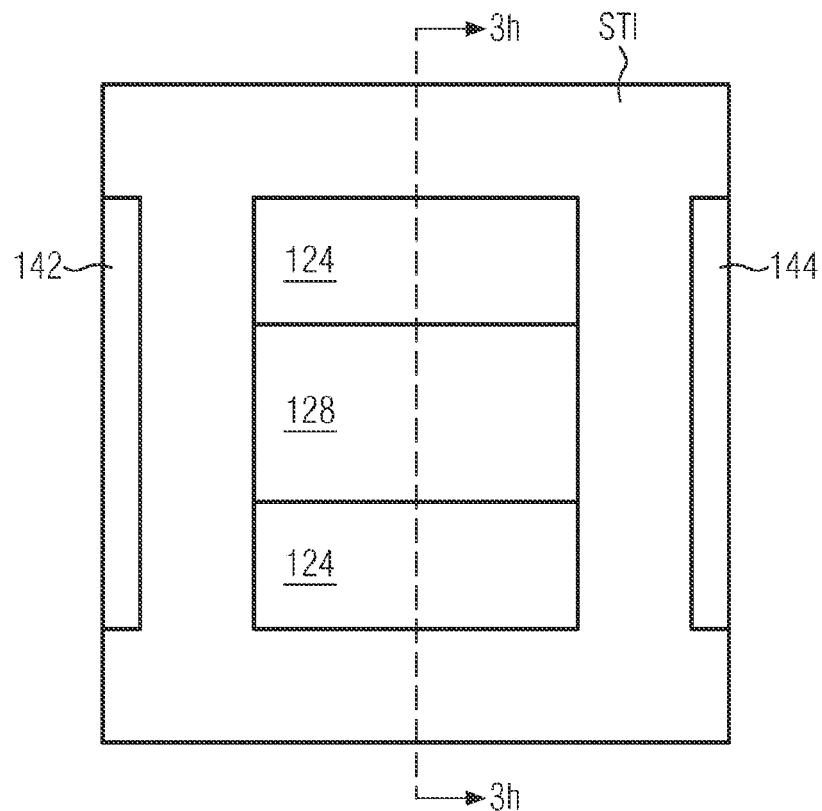

FIG. 3g schematically illustrates, in a top view, the active region 130 enclosed by the STI region and portions of adjacent active regions 142, 144 that are separated from the active region 130 by STI structures.

Figure 3H:
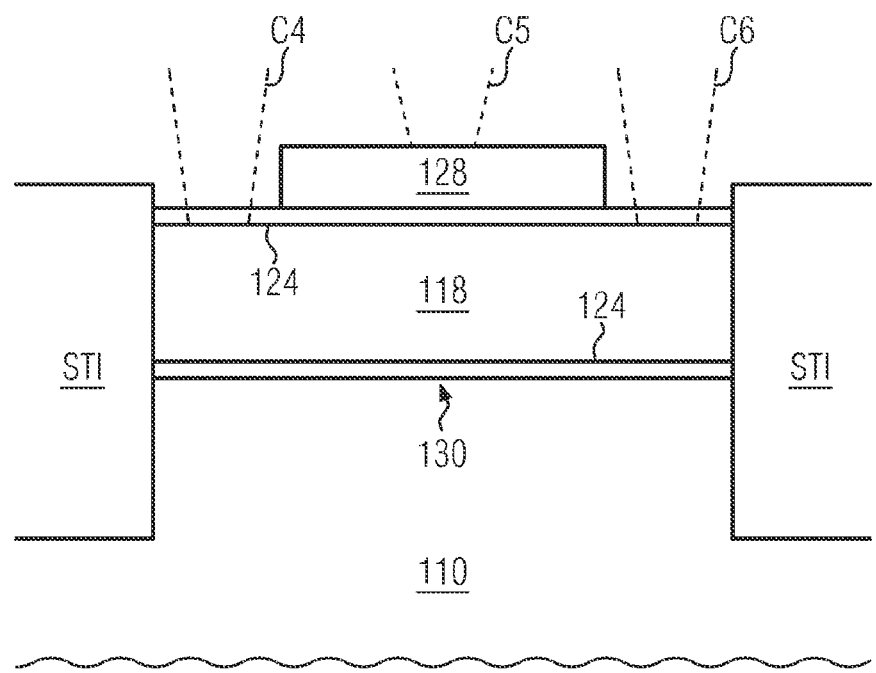

Referring to FIG. 3h, a cross-section along the line 3h-3h in FIG. 3g is schematically illustrated, wherein contacts C4, C5 and C6 in accordance with techniques described above with regard to the contacts C1, C2 and C3 are formed during subsequent processing in accordance with the description for FIG. 2b.

The person skilled in the art will appreciate that the insulating material 24, 124 in accordance with various illustrative embodiments of the present disclosure may include a high-k material. Accordingly, semiconductor devices of the present disclosure may be formed in employing advanced high-k/metal gate techniques for forming complex GAA FET devices. Herein, the buried insulating material, such as the buried insulating material layer 14 and/or 114, may be provided by a high-k material and the electrode material may be provided by a metal gate material, as described above with regard to the FIGS. 1a-1f and 2a-2b. The person skilled in the art will appreciate that, in employing high-k/metal gate techniques, the various etchings performed during the processes described with regard to FIGS. 1a-1f and 3a-3h are to be accordingly adjusted. Alternatively, the electrode material 28, 128 may be a polysilicon or amorphous silicon material and the insulating material layer surrounding the channel portion may include silicon oxide.

In various aspects of the present disclosure, a method of forming a semiconductor device and a semiconductor device are provided. In accordance with some illustrative embodiments herein, an SOI substrate portion having a semiconductor layer, a buried insulating material layer and a bulk substrate is provided, wherein the buried insulating material layer is interposed between the semiconductor layer and the bulk substrate. The SOI substrate portion is subsequently patterned so as to form a patterned bi-layer stack on the bulk substrate, which bi-layer stack comprises a patterned semiconductor layer and a patterned buried insulating material layer. The bi-layer stack is further enclosed with a further insulating material layer and an electrode material is formed on and around the further insulating material layer. Herein a gate electrode is formed by the bulk substrate and the electrode material such that the gate electrode substantially surrounds a channel portion formed by a portion of the patterned buried insulating material layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    providing an SOI substrate portion with a semiconductor layer, a buried insulating material layer and a bulk substrate, said buried insulating material layer being interposed between said semiconductor layer and said bulk substrate;
    patterning said SOI substrate portion and forming a patterned bi-layer stack from said buried insulating material layer and said semiconductor layer on said bulk substrate, said patterned bi-layer stack comprising a patterned buried insulating material layer and a patterned semiconductor layer;
    enclosing said patterned bi-layer stack with a further insulating material layer; and
    forming an electrode material on and around said further insulating material layer, wherein a gate electrode is formed by said bulk substrate and said electrode material such that said gate electrode substantially surrounds a channel portion formed by a portion of said patterned semiconductor layer.

2. The method of claim 1, wherein said further insulating material layer substantially matches said buried insulating material layer in at least one of thickness, k value, uniformity, quality and material.

3. The method of claim 1, wherein said buried insulating material layer has a thickness of substantially less than about 10 nm.

4. The method of claim 3, wherein said buried insulating layer has a thickness substantially smaller than about 5 nm.

5. The method of claim 1, wherein, said enclosing said patterned bi-layer stack comprises depositing said further insulating material layer over said patterned bi-layer stack and performing an etch process to remove said further insulating material layer on said bulk substrate.

6. The method of claim 1, wherein said forming said gate electrode comprises depositing polysilicon material, patterning said deposited polysilicon material and etching said patterned polysilicon material.

7. The method of claim 1, wherein said electrode material and said bulk substrate are electrically conducting coupled.

8. The method of claim 1, further comprising forming a shallow-trench-isolation (STI) structure, said STI structure laterally enclosing said SOI substrate portion.

9. The method of claim 8, wherein said SOI substrate is patterned such that said patterned bi-layer stack is laterally surrounded by a recess formed between said STI structure and said patterned bi-layer stack, said recess exposing an upper surface of said bulk substrate.

10. The method of claim 9, wherein said patterned bi-layer stack is enclosed by said further insulating material layer by forming said further insulating material layer within said recess and on and around said patterned bi-layer stack.

11. The method of claim 10, wherein said forming said gate electrode comprises forming a gate mask pattern over said SOI substrate portion and depositing electrode material in said recess and over an upper surface of said patterned bi-layer stack.

12. A method of forming a semiconductor device, the method comprising:
    providing an SOI substrate portion with a semiconductor layer, a buried insulating material layer and a bulk substrate, said buried insulating material layer being interposed between said semiconductor layer and said bulk substrate;
    performing at least one etching process to form a patterned bi-layer stack on said bulk substrate, said patterned bi-layer stack comprising a patterned portion of said buried insulating material layer and a patterned portion of said semiconductor layer;
    depositing a further insulating material layer on an upper surface of said bulk substrate and around said patterned bi-layer stack, said further insulating material layer enclosing said patterned bi-layer stack;
    performing an etch process to remove at least a portion of said further insulating material layer from above said upper surface of said bulk substrate and thereby expose a portion of said upper surface of said bulk layer; and
    forming an electrode material on and around said further insulating material layer and on and in contact with said exposed upper surface of said bulk substrate, wherein a gate electrode is formed by said bulk substrate and said electrode material such that said gate electrode substantially surrounds a channel portion formed by a portion of said patterned semiconductor layer.

13. The method of claim 12, wherein said further insulating material layer and said buried insulating material layer are comprised of the same material.

14. The method of claim 12, wherein said further insulating material layer and said buried insulating material layer have substantially the same thickness.

15. The method of claim 12, wherein said buried insulating layer has a thickness substantially smaller than about 5 nm.

16. The method of claim 12, wherein forming said gate electrode comprises depositing polysilicon material, patterning said deposited polysilicon material and etching said patterned polysilicon material.

17. The method of claim 12, wherein said electrode material and said bulk substrate are electrically coupled to one another.

18. The method of claim 12, further comprising:
    forming a shallow-trench-isolation (STI) structure, said STI structure laterally enclosing said SOI substrate portion;
    patterning said SOI substrate portion to define said patterned bi-layer stack and a recess between said STI structure and said patterned bi-layer stack, said recess exposing an upper surface of said bulk substrate;
    wherein depositing said further insulating material layer comprises depositing said further insulating material layer within said recess and on and around said patterned bi-layer stack; and
    wherein forming said gate electrode comprises depositing electrode material in said recess and over an upper surface of said patterned bi-layer stack.

19. A method of forming a semiconductor device, the method comprising:

providing an SOI substrate portion with a semiconductor layer, a buried insulating material layer and a bulk substrate, said buried insulating material layer being interposed between said semiconductor layer and said bulk substrate;

performing at least one etching process to form a patterned bi-layer stack on said bulk substrate, said patterned bi-layer stack comprising a patterned portion of said buried insulating material layer and a patterned portion of said semiconductor layer;

depositing a further insulating material layer on an upper surface of said bulk substrate and around said patterned bi-layer stack, said further insulating material layer enclosing said patterned bi-layer stack;

performing an etch process to remove at least a portion of said further insulating material layer from above said upper surface of said bulk substrate and thereby expose a portion of said upper surface of said bulk layer;

depositing a layer of electrode material on and around said further insulating material layer and on and in contact with said exposed upper surface of said bulk substrate;

patterning said layer of electrode material so as to define a gate electrode comprised of said bulk substrate and a patterned portion of said electrode material layer such that said gate electrode substantially surrounds a channel portion formed by a portion of said patterned semiconductor layer; and forming a plurality of source/drain contacts that extend through said further insulating material layer and contact portions of said patterned semiconductor layer of said patterned bi-layer stack that are not covered by said patterned portion of said electrode material layer.

20. The method of claim 19, wherein said further insulating material layer and said buried insulating material layer are comprised of the same material and have substantially the same thickness.

* * * * *